United States Patent
Lye et al.

(10) Patent No.: US 10,587,281 B2
(45) Date of Patent: Mar. 10, 2020

(54) RADIO FREQUENCY FLASH ADC CIRCUITS

(71) Applicant: Maxlinear Asia Singapore PTE LTD, Singapore (SG)

(72) Inventors: William Michael Lye, Coquitlam (CA); Anthony Eugene Zortea, Pipersville, PA (US); Jatinder Chana, Burnaby (CA)

(73) Assignee: Maxlinear Asia Singapore PTE LTD, Singapore (SG)

( * ) Notice: Subject to any disclaimer, the term of this patent is extended or adjusted under 35 U.S.C. 154(b) by 12 days.

(21) Appl. No.: 16/147,269

(22) Filed: Sep. 28, 2018

(65) Prior Publication Data

US 2019/0036539 A1 Jan. 31, 2019

Related U.S. Application Data

(63) Continuation of application No. 15/830,144, filed on Dec. 4, 2017, now Pat. No. 10,141,945, which is a continuation of application No. 15/241,526, filed on Aug. 19, 2016, now Pat. No. 9,847,788.

(60) Provisional application No. 62/207,518, filed on Aug. 20, 2015.

(51) Int. Cl.
| | |
|---|---|
| *H03M 1/00* | (2006.01) |
| *H03M 1/12* | (2006.01) |
| *H03M 1/20* | (2006.01) |
| *H03K 5/24* | (2006.01) |
| *H03M 1/10* | (2006.01) |
| *H03M 1/36* | (2006.01) |

(52) U.S. Cl.
CPC .......... *H03M 1/1245* (2013.01); *H03K 5/249* (2013.01); *H03M 1/204* (2013.01); *H03M 1/1023* (2013.01); *H03M 1/365* (2013.01)

(58) Field of Classification Search
CPC .... H03M 1/1245; H03M 1/204; H03M 1/365; H03M 1/1023; H03M 1/124; H03K 5/249; G11C 27/02
USPC ....................... 341/155, 172, 122; 455/562.1
See application file for complete search history.

(56) References Cited

U.S. PATENT DOCUMENTS

| | | | | |
|---|---|---|---|---|
| 5,196,806 A | * | 3/1993 | Ichihara | H03G 3/3047 330/137 |
| 5,977,831 A | * | 11/1999 | Davis | H03G 3/3042 330/129 |
| 7,339,426 B2 | * | 3/2008 | Gurvich | H03F 1/0211 330/136 |
| 8,295,791 B2 | * | 10/2012 | Chang | H03F 1/345 375/296 |
| 9,847,788 B2 | | 12/2017 | Lye et al. | |

(Continued)

*Primary Examiner* — Jean B Jeanglaude

(74) *Attorney, Agent, or Firm* — McAndrews, Held & Malloy, Ltd.

(57) ABSTRACT

A system and method for sampling an RF signal uses a plurality of capacitors, a plurality of resistors, and a sampling circuit. A first port of each capacitor of the plurality of capacitors is coupled to the RF signal. A first port of each resistor of the plurality of resistors is coupled to one of a plurality of reference levels. A second port of each resistor of the plurality of resistors is coupled to a second port of a corresponding capacitor of the plurality of capacitors. The sampling circuit produces a plurality of digital outputs by sampling the second port of each resistor of the plurality of resistors.

20 Claims, 16 Drawing Sheets

(56) References Cited

U.S. PATENT DOCUMENTS

2010/0285833 A1* 11/2010 Chang .................... H03F 1/345
455/550.1
2015/0214973 A1 7/2015 Man et al.
2015/0280731 A1 10/2015 Moazzami et al.
2016/0099721 A1* 4/2016 Okura ................. H03M 1/0609
341/172

* cited by examiner

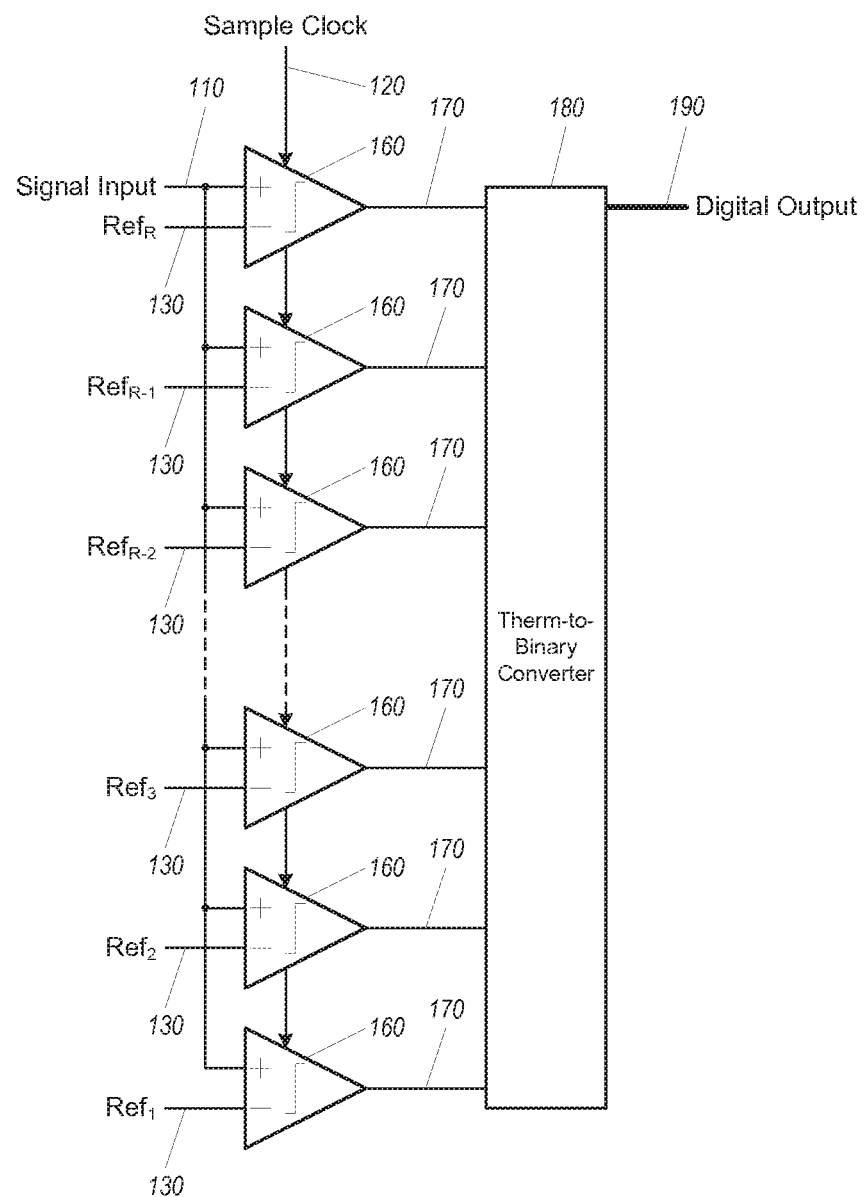
Figure 1. Flash ADC with Sample & Hold

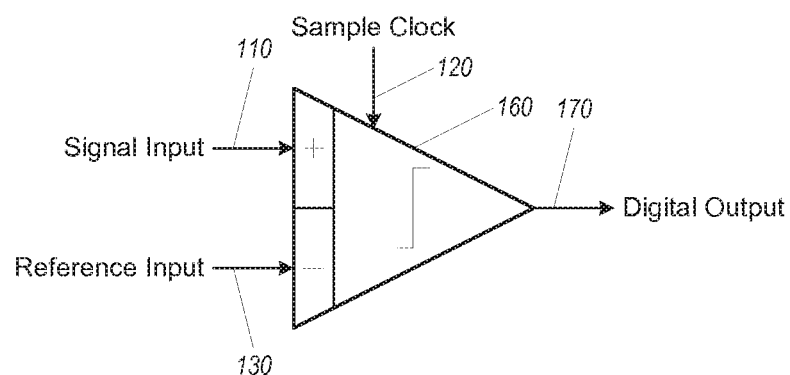
Figure 2A. Single-Ended Comparator
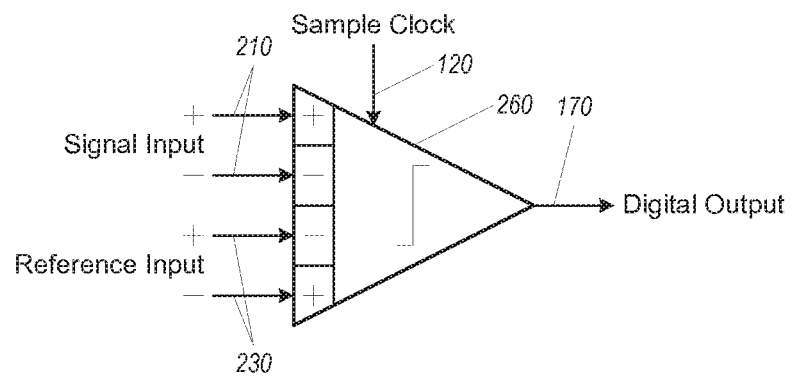
Figure 2B. Differential Comparator

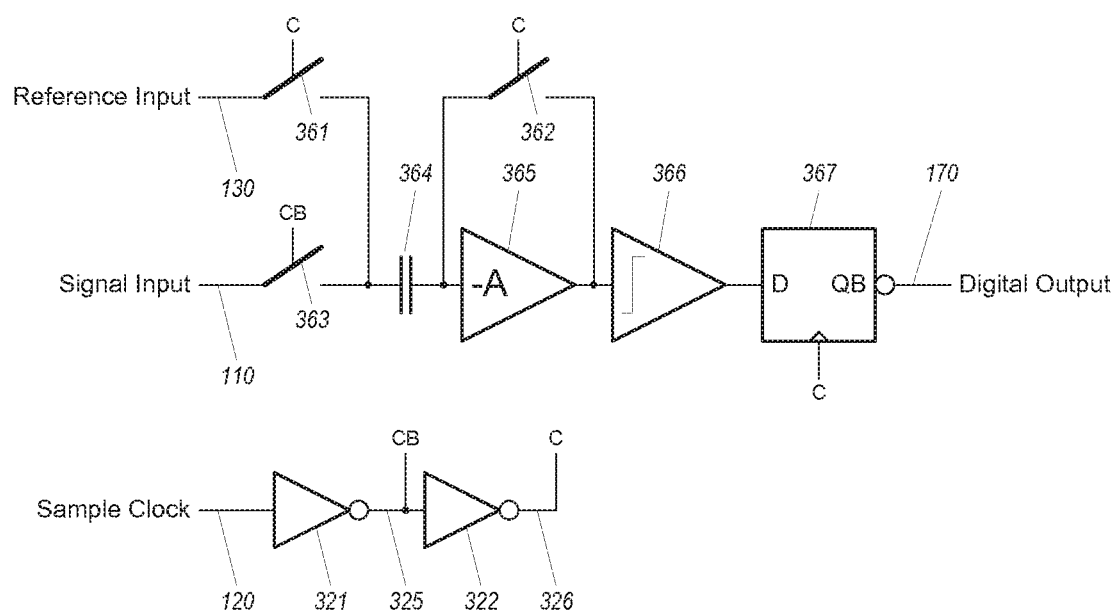
Figure 3A. Single-Ended Switched-Capacitor
Flash ADC Comparator

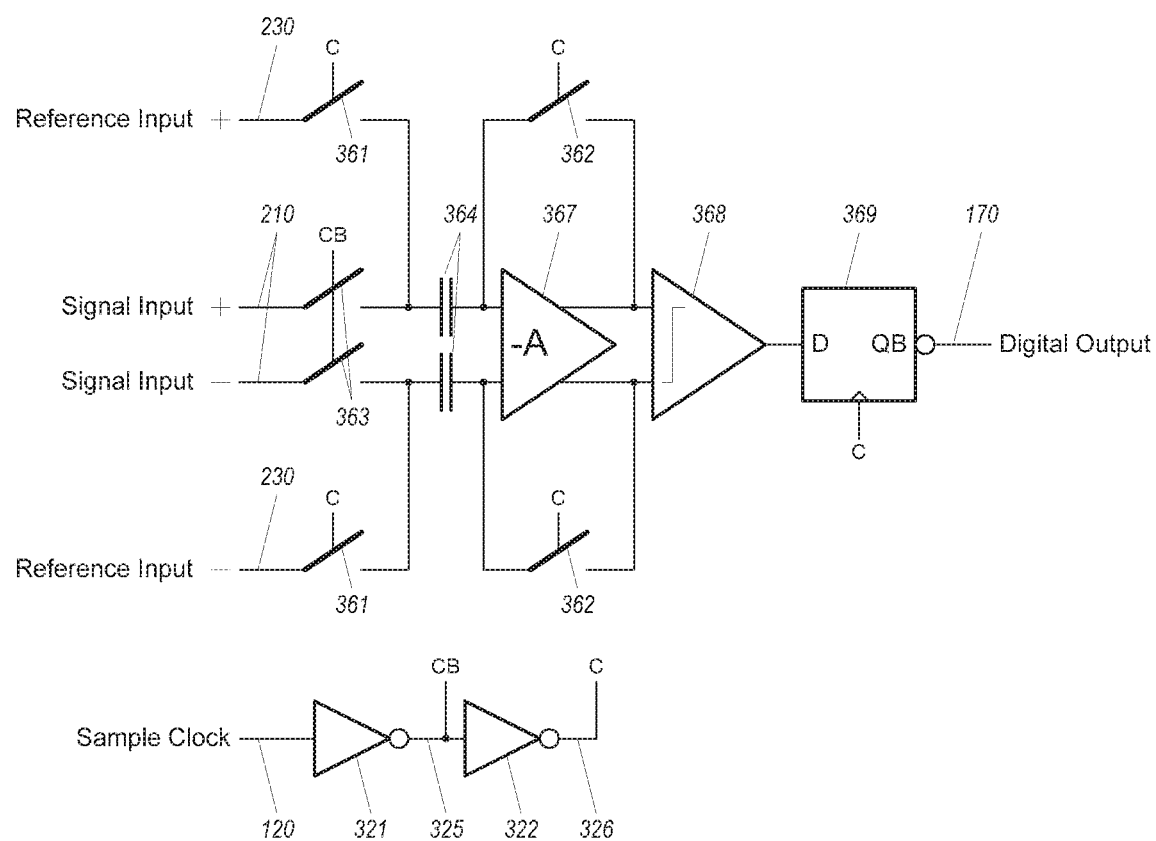
Figure 3B. Differential Switched-Capacitor Flash ADC Comparator

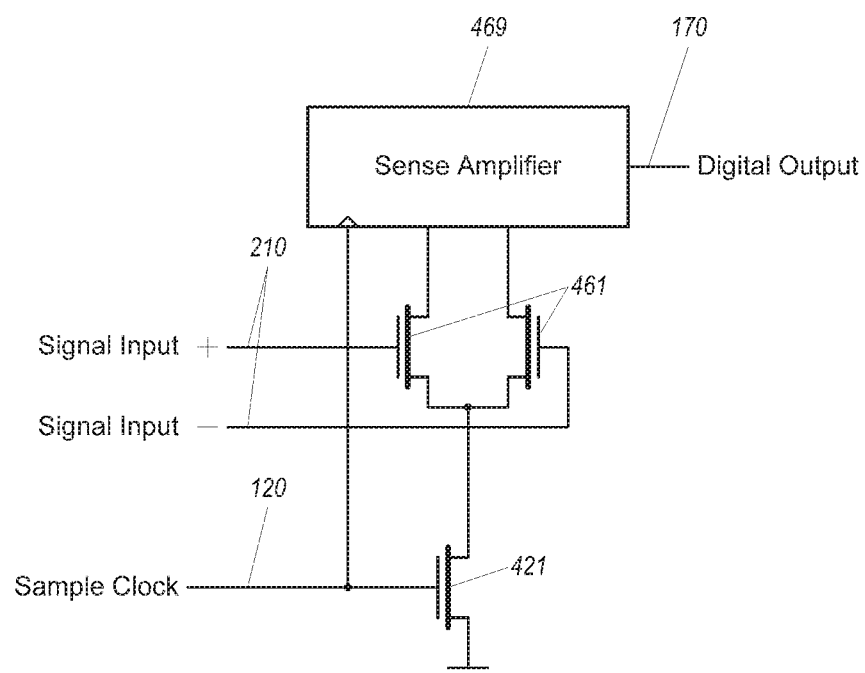
Figure 4. Differential Sense Amplifier Comparator

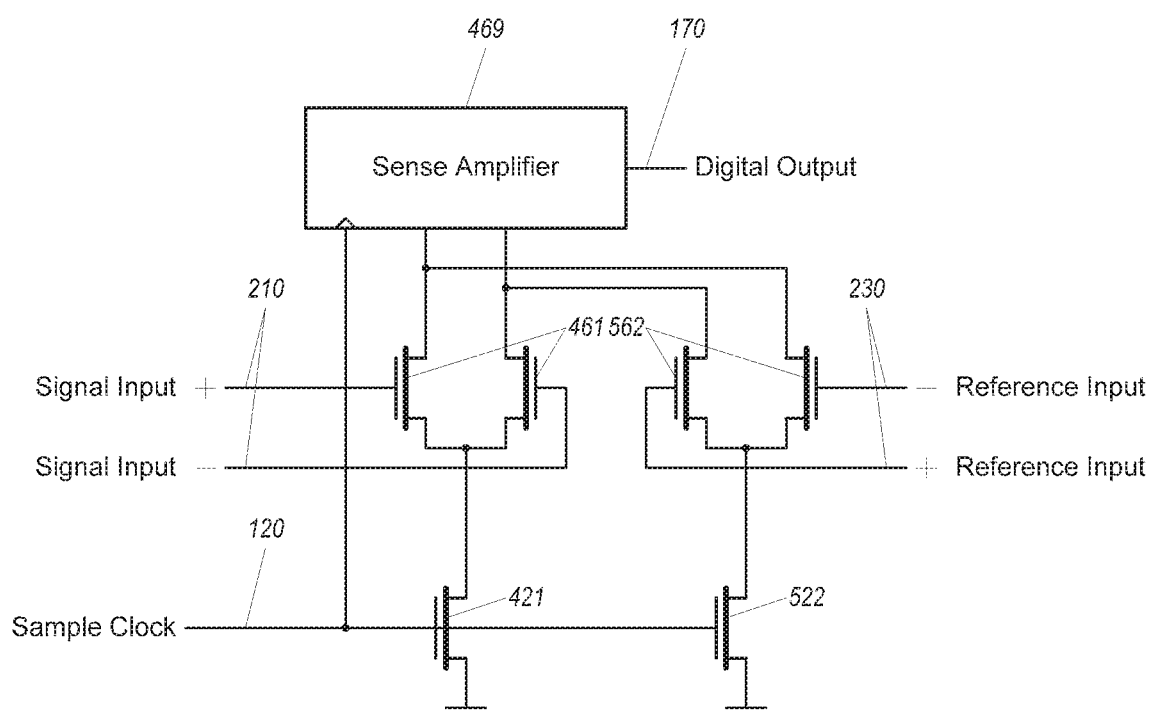
Figure 5. Differential Subtracting Sense Amplifier Comparator

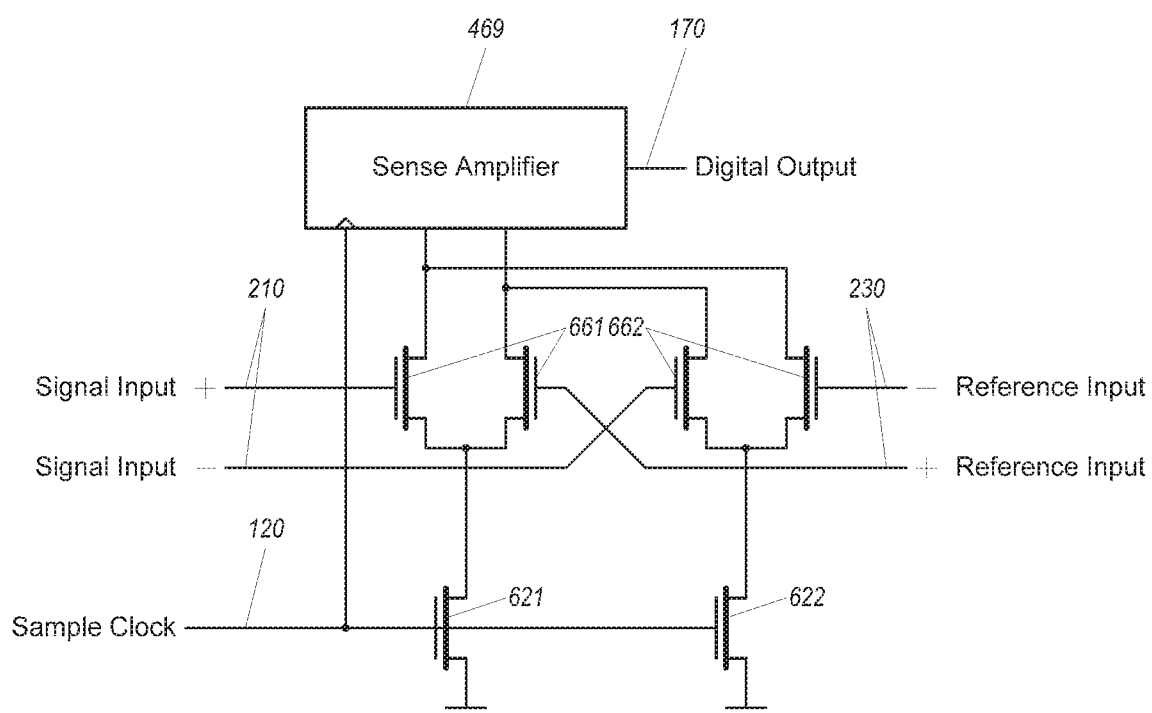
Figure 6. Differential Subtracting Sense Amplifier Flash ADC Comparator

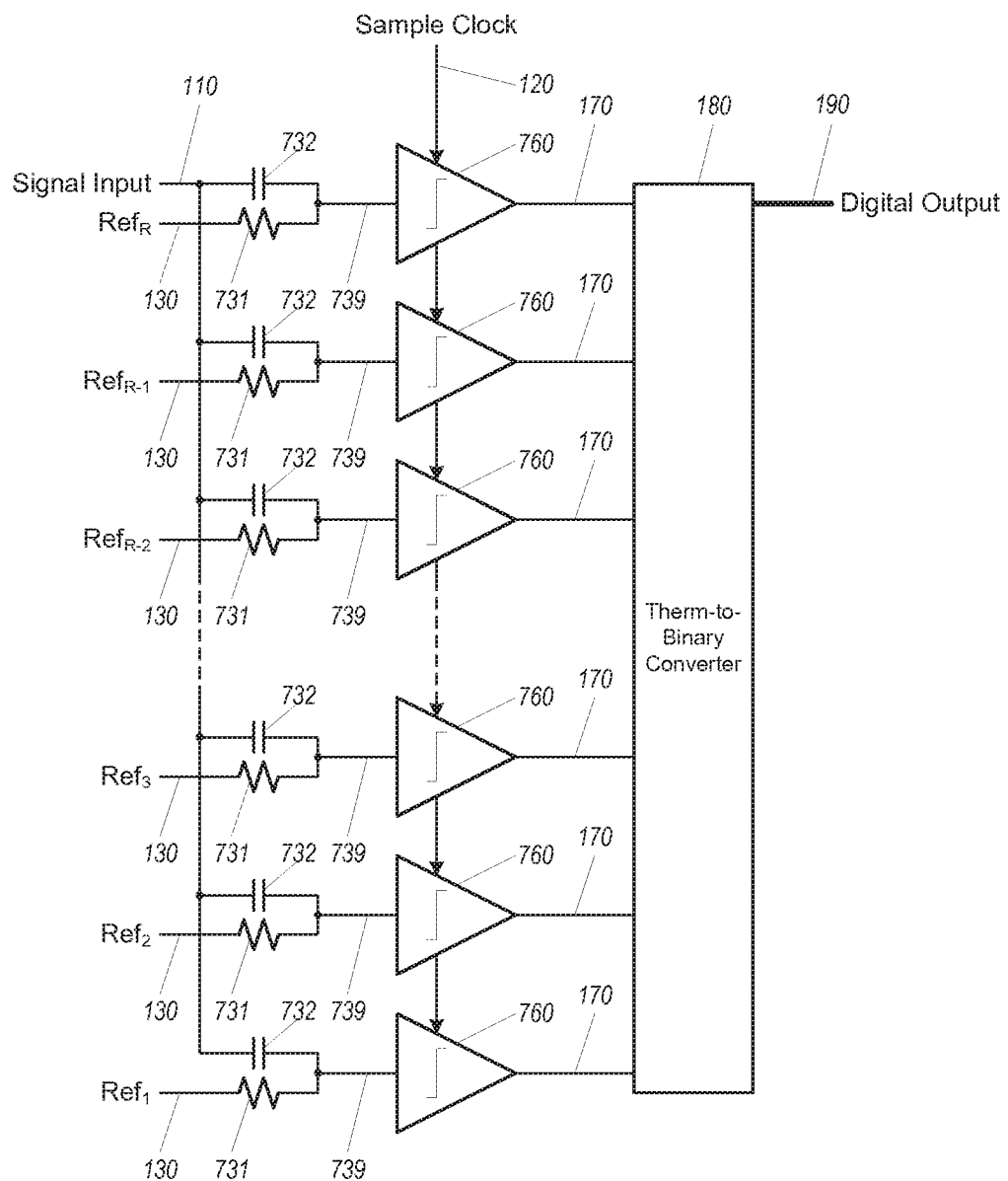
Figure 7. RF Flash ADC with AC-Coupled References

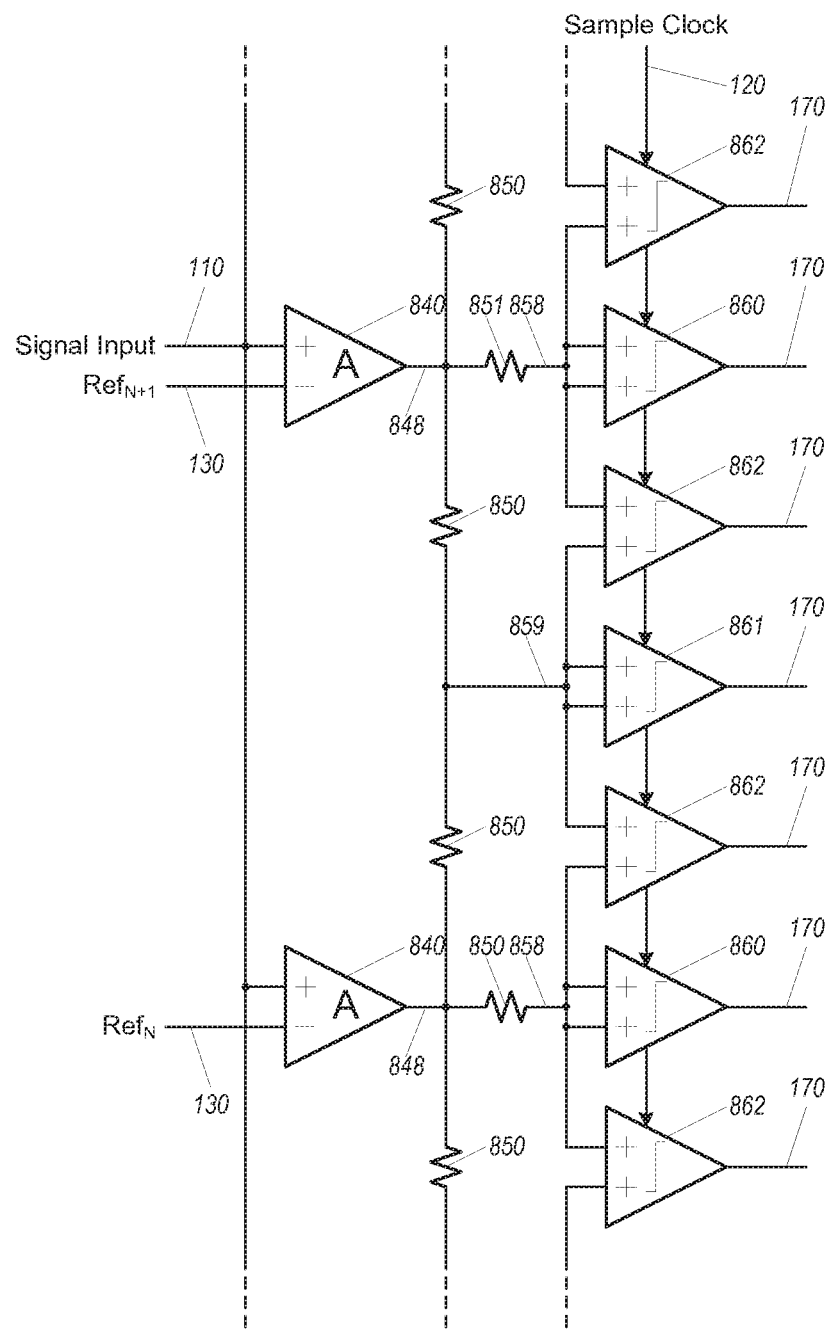
Figure 8. Flash ADC Interpolation

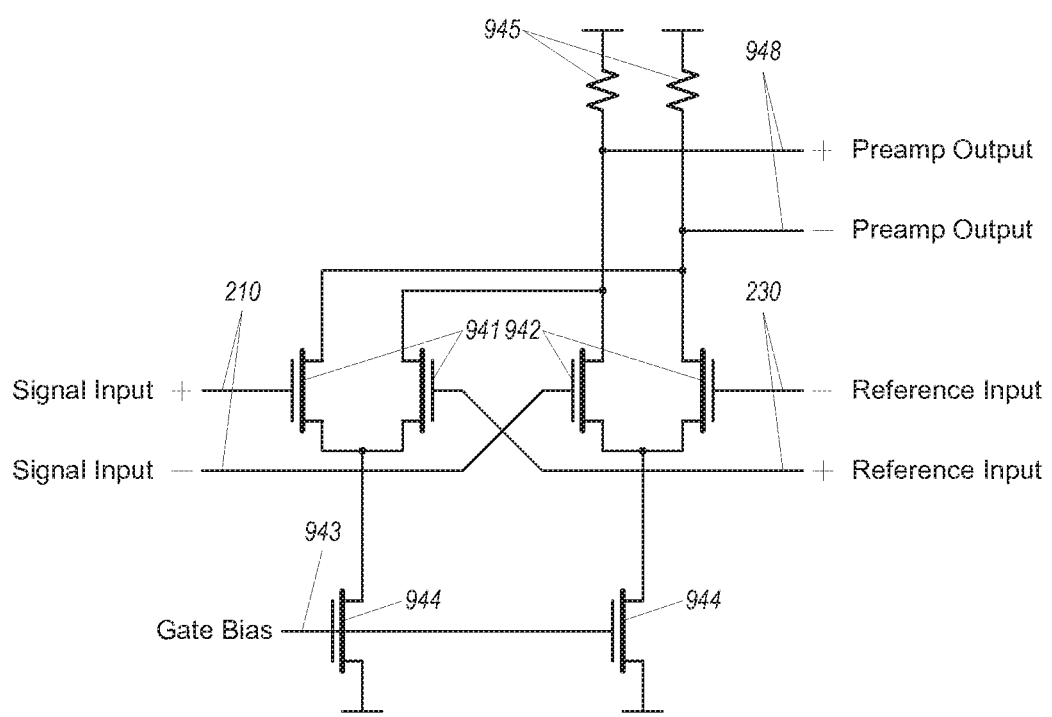
Figure 9. Interpolating Flash ADC Preamplifier

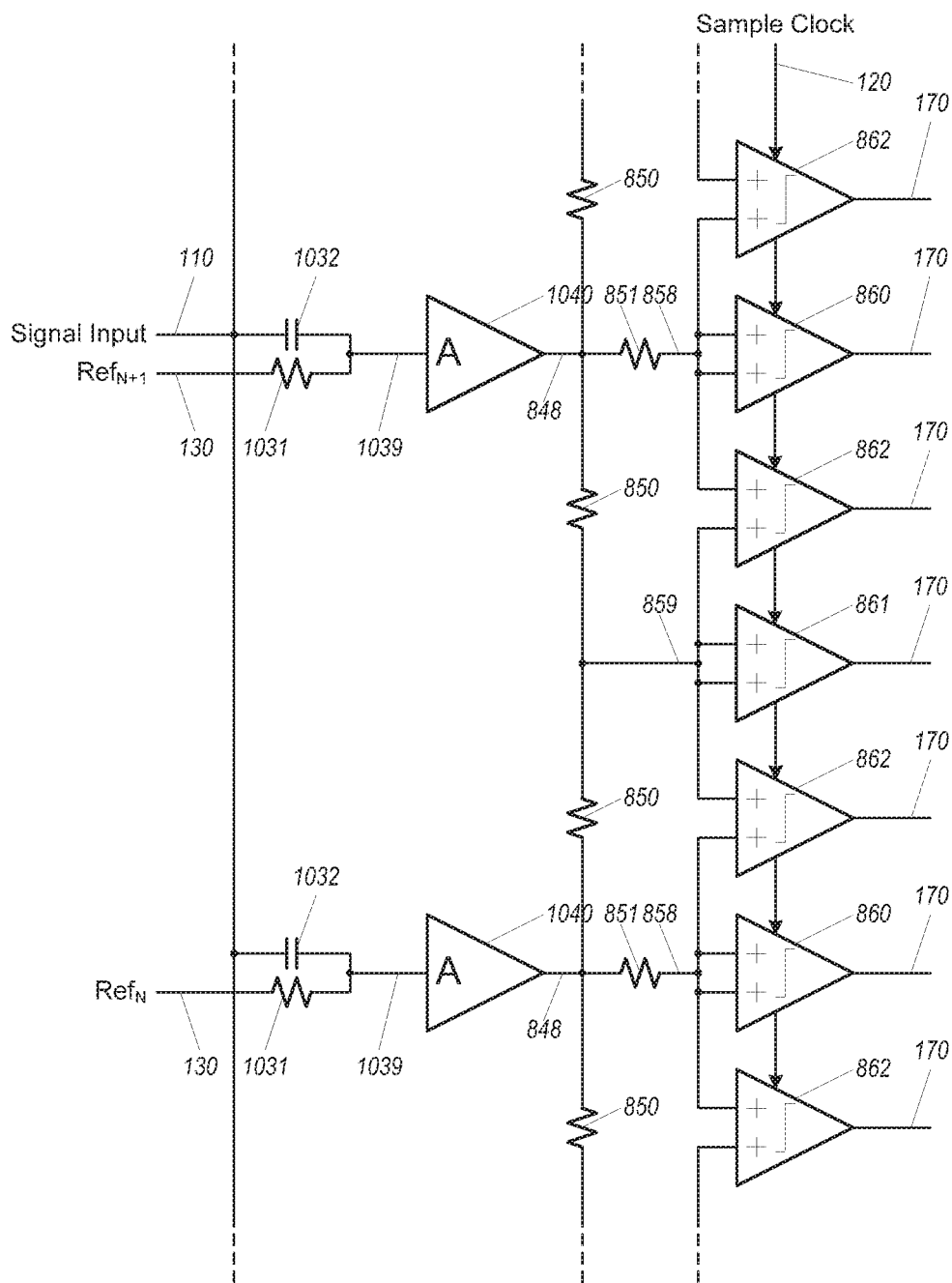
Figure 10. Flash ADC Interpolation
with AC-Coupled References

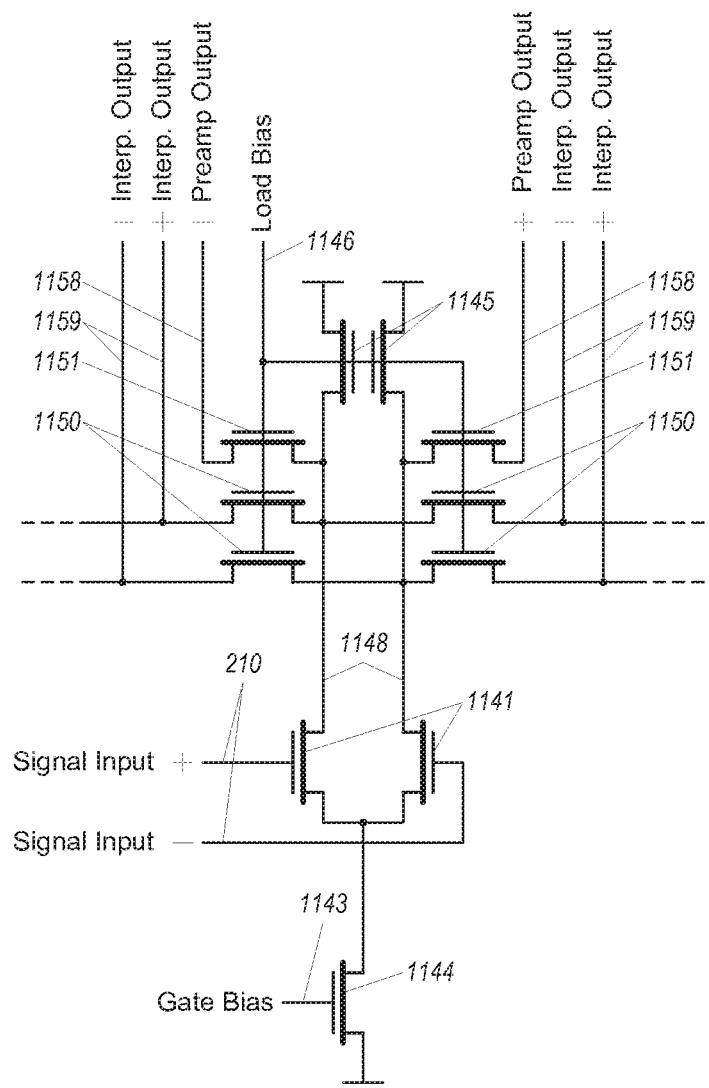
Figure 11. Flash ADC Preamplifier/Interpolator for AC-Coupled References

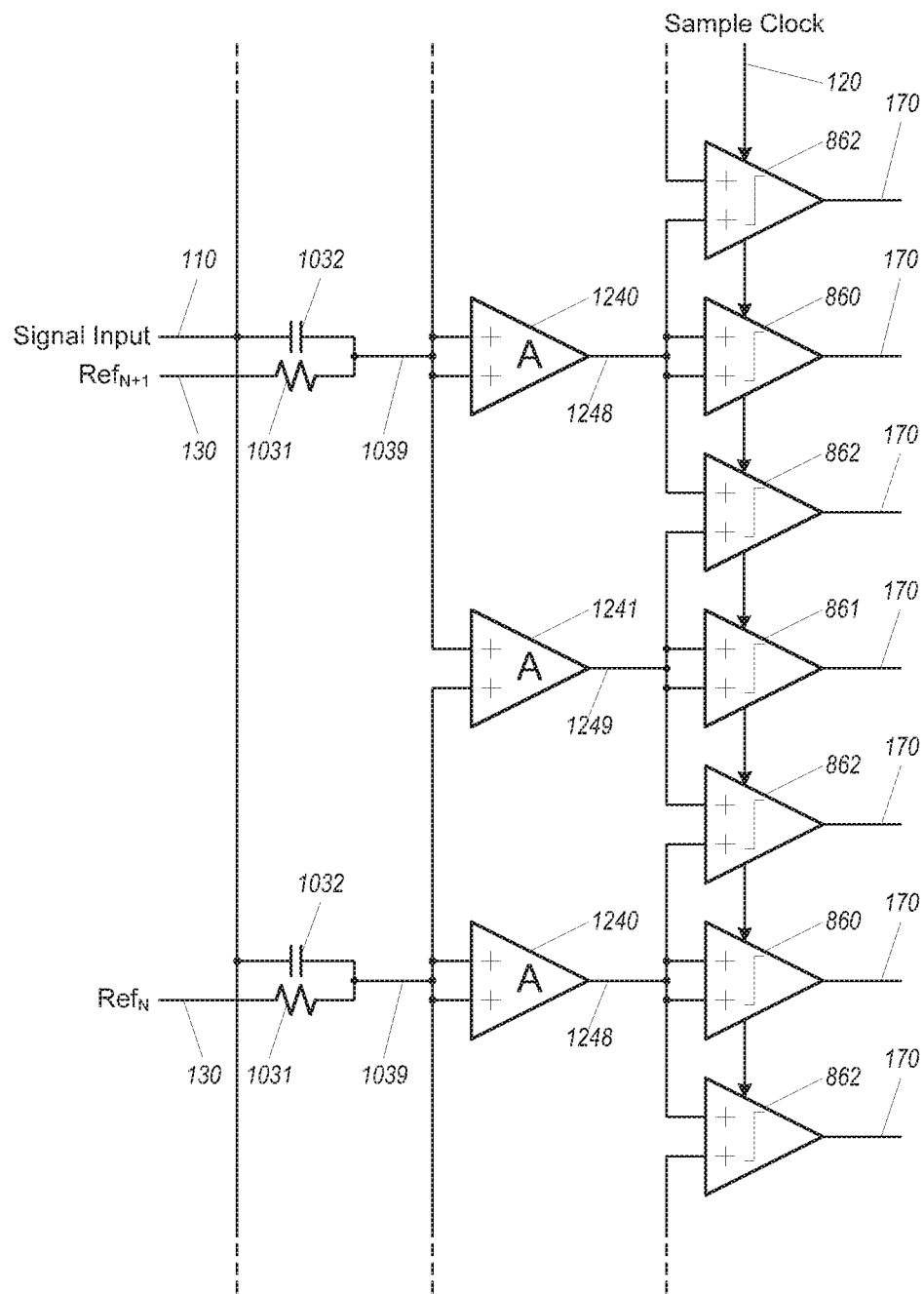
Figure 12. Alternate Flash ADC Interpolation
with AC-Coupled References

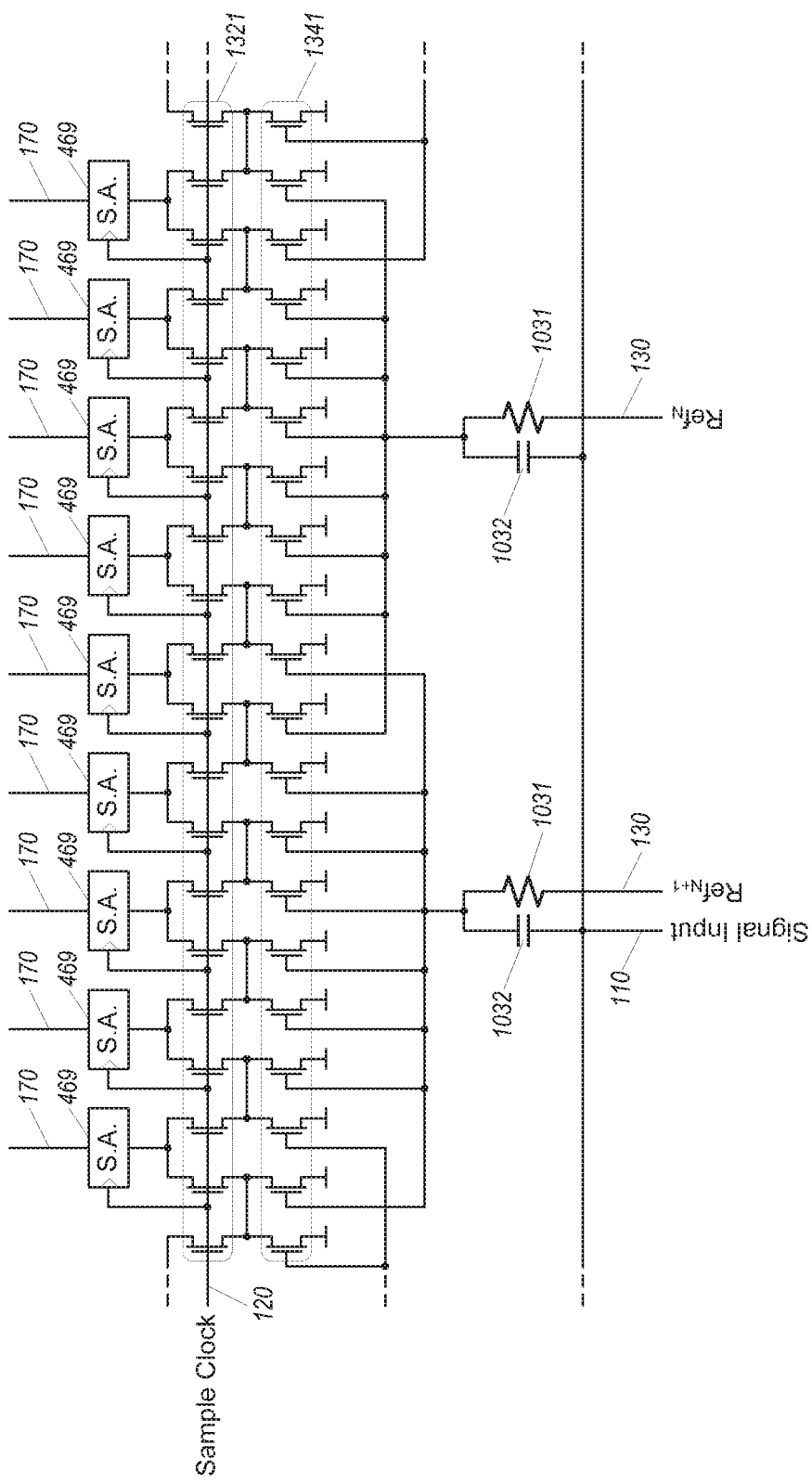
Figure 13. Efficient Alternate Flash ADC Interpolation with AC-Coupled References

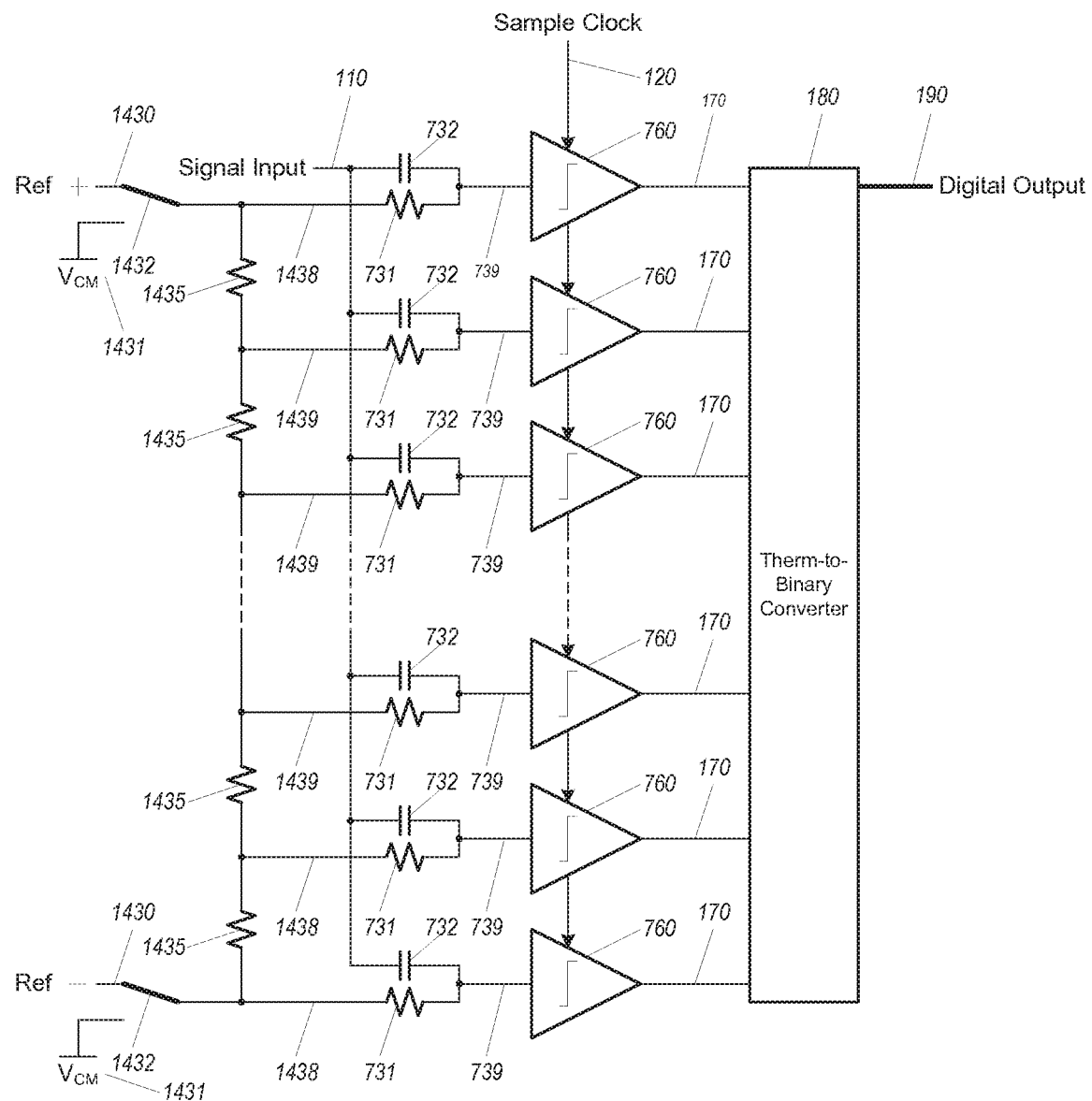
Figure 14. RF Flash ADC with Controllable AC-Coupled References

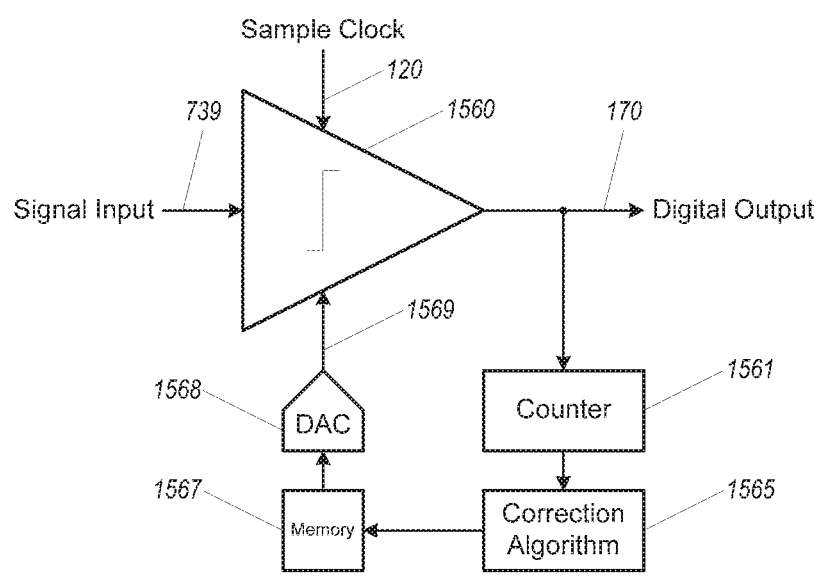
Figure 15. Flash ADC Comparator With Power-UP Offset Correction

RADIO FREQUENCY FLASH ADC CIRCUITS

RELATED APPLICATIONS

This application is a continuation of U.S. patent application Ser. No. 15/830,144, filed Dec. 4, 2017, which is a continuation of U.S. patent application Ser. No. 15/241,526 (now U.S. Pat. No. 9,847,788), filed Aug. 19, 2016, which claims the benefit of and priority to U.S. Provisional Patent Application No. 62/207,518, filed Aug. 20, 2015. The above identified applications are hereby incorporated herein by reference in their entirety.

FIELD

The field of the invention is that of RF Flash ADCs, particular in applications which involve high SNR and high SFDR.

BACKGROUND

Existing methods and systems for analog-to-digital conversion may have many shortcomings. Further limitations and disadvantages of conventional and traditional approaches will become apparent to one of skill in the art, through comparison of such approaches with some aspects of the present method and apparatus set forth in the remainder of this disclosure with reference to the drawings.

BRIEF DESCRIPTION OF THE DRAWINGS

Embodiments of the present disclosure will now be described, by way of example only, with reference to the attached Figures.

FIG. 1 shows a Flash ADC.

FIG. 2A shows a single-ended clocked comparator.

FIG. 2B shows a differential clocked comparator.

FIG. 3A shows a single-ended switched-capacitor Flash ADC comparator.

FIG. 3B shows a differential switched-capacitor Flash ADC comparator.

FIG. 4 shows a differential sense amplifier comparator.

FIG. 5 shows a differential subtracting sense amplifier comparator.

FIG. 6 shows a differential subtracting sense amplifier Flash ADC comparator.

FIG. 7 shows an embodiment of a radio frequency Flash ADC with AC-coupled references, in accordance with the present disclosure.

FIG. 8 shows an ADC interpolation circuit.

FIG. 9 shows an interpolating Flash ADC preamplifier.

FIG. 10 shows an embodiment of a Flash ADC interpolation circuit with AC-coupled references, in accordance with the present disclosure.

FIG. 11 shows an embodiment of a Flash ADC preamplifier/interpolator for AC-coupled references, in accordance with the present disclosure.

FIG. 12 shows another embodiment of a Flash ADC preamplifier/interpolator for AC-coupled references, in accordance with the present disclosure.

FIG. 13 shows an embodiment of Flash ADC interpolation with AC-coupled references, in accordance with the present disclosure.

FIG. 14 shows an embodiment of an RF Flash ADC with controllable AC-coupled references, in accordance with the present disclosure.

FIG. 15 shows an embodiment of a Flash ADC comparator with power-up offset correction, in accordance with the present disclosure.

DETAILED DESCRIPTION

When building Analog/Digital Converters (ADCs) there are many techniques and architectures that may be used. One of the simplest architectures to build and understand is the so-called Flash ADC, and many other ADC architectures, including the Pipelined, Sub-Ranging, and Folding & Interpolating ADCs may include smaller Flash ADCs as sub-components. In addition to its inherent simplicity, the Flash ADC is generally the fastest ADC architecture in a given technology.

A Flash ADC is shown in FIG. 1. This ADC compares an analog input 110 to a number (R) of individual reference levels 130 using R individual comparators (also known as "slicers" or "samplers") 160, each of which is clocked by the sample clock 120. On the rising edge of the sample clock, the comparators produce R independent digital outputs 170 that encode whether the signal input is above or below the reference levels. The digital comparator outputs, when taken as a whole, form a thermometer-coded (also known as unary-coded) digital representation of the analog input, which is then usually converted into a binary-coded digital representation at the ADC output 190 using a binary-to-thermometer converter 180. The inherent parallelism, with R independent reference voltages and comparators, produces the unary-coded digital representation of the analog input in a single operation with a minimum of circuitry and without requiring additional steps or iteration.

Depending upon the application, elements may be added to or removed from the Flash ADC of FIG. 1. For example, in certain scenarios a Sample & Hold (S&H) circuit may be added between the signal input and the comparators, or additional circuitry such as observation multiplexers or bubble code removal circuits may be added to the digital circuitry after the comparators. Even with these modifications, the fundamental Flash architecture, a large array of parallel comparators with independent reference levels remains constant.

FIG. 1 and most succeeding figures show signals as single-ended voltages and show circuits as single-ended implementations, however depending upon the specifics of the implementation and application signals and circuits may be differential, and the signals may be some other representation, for example current or charge. Also, this figure and all succeeding figures use common identifiers to identify common elements, and use similar identifiers to identify similar elements.

ADC resolution is fundamental in that it determines what the Quantization Noise (ON) of the signal is, and in turn ON sets a fundamental floor on how accurate the digital output represents the analog input. In general, the resolution of an ADC may be expressed by the output binary digital signal bit width N, which in a Flash ADC is set by R; if a Flash has R reference levels, it can usually resolve R+1 signal levels. The output resolution N and Signal-to-Quantization Noise Ratio (SQNR) are given by Equation 1:

$$PNOB = \log_2(R+1)$$
$$SQNR = 1.76 \text{ dB} + PNOB \cdot 6.02 \text{ dB}$$
$$N = \lceil PNOB \rceil \quad \text{Equation 1}$$

Equation 1 introduces an additional term, PNOB. PNOB (Physical Number of Bits) is a common term of the art used to describe ADCs where the effective output resolution due to SQNR (often expressed as ENOB for Equivalent Number of Bits) does not match the actual physical implementation (the PNOB). In addition to QN, the output Signal-to-Noise Ratio (SNR) also includes impairments such as circuit noise and distortion (or linearity), with the result that for Nyquist-rate ADC's, usually SNR≤SQNR and ENOB≤PNOB. For oversampled ADCs that include Digital Signal Processing (DSP) decimation operations usually ENOB≥PNOB, however the details of this are beyond the scope of this document. For Flash ADCs where R+1 is not a power of 2, PNOB≤N.

In order have high SQNR, a Flash ADC requires R to be large. As a result, Flash ADC's may be limited to relatively small N because increasing N by 1 requires R to double, which in turn generally doubles area and power of the converter. Alternative architectures (like a Pipelined ADC) see much more modest increase in area and power with increasing N. However these alternative architectures are generally slower than the Flash, which means that Flash ADCs may be considered for the highest sample rate applications, particularly if the required resolution N is low. For example, serial digital receivers running at 10 Gbit/s or higher may use low-resolution (N=3 ... 5) Flash ADC's as their front end, using custom DSP back ends to equalize and de-serialize the incoming data.

ADC designs may include parallel interleaving of multiple lower-speed ADCs (for example Parallel Pipeline and Parallel Successive Approximation Register ADCs) in order to improve their sampling rates, however these ADCs all require S&H front ends which create challenges of their own. For some applications, Flash ADCs characteristics still outperform the parallel ADC architectures.

Because the Flash ADC is a parallel circuit with R more or less identical comparators, the area and power of the complete ADC tends to be dominated by the comparator implementation. Adding a S&H circuit before the comparators may simplify the comparator design, however a S&H circuit that is capable of running as fast as the comparators will itself be large and power hungry. The remainder of this document will focus on applications that do not include the S&H.

Flash ADC Comparators

Single-ended and differential clocked comparators are shown in FIG. 2A and FIG. 2B respectively. On the rising edge of the sample clock 120, a single-ended comparator (160, FIG. 2A) essentially subtracts the reference input 130 from the signal input 110, and depending upon the sign of this difference produces a 2-level digital signal (high or low) at the output 170. Similarly, a differential comparator (260, FIG. 2B) subtracts the differential reference 230 from the differential input 210, and similarly produces a digital signal at the output on the rising edge of the sample clock.

Flash ADC comparators may be implemented using switched-capacitor circuits to perform the subtraction. Two examples of such comparators are shown in FIG. 3. As with FIG. 2, FIG. 3A shows a single-ended comparator, while FIG. 3B shows a differential comparator.

The single-ended comparator in FIG. 3A shows the features of many such structures. The actual comparator consists of three switches 361, 362, and 363, a capacitor 364, a gain element 365, an actual decision making element 366 and an edge-triggered memory element 367. The sample clock 120 is buffered by two digital inverters 321 and 322 to create complementary internal clocks CB 325 and C 326. During normal operation, when the sample clock is high, switches 361 and 362 are closed while switch 363 is open. Closing switch 362 places the gain element 365 (which is inverting, indicated by the "−A" notation) into a negative feedback loop with the end result that both the input and output of the gain element are held at a mid-scale level. At the same time, closing switch 361 connects the reference input 130 to the input side of the capacitor while the other side is held at the gain element's mid-scale level. When the sample clock transitions from high to low, switches 361 and 362 open and switch 363 closes. Closing switch 363 connects the input signal 110 to the input side of the capacitor, which, due to charge conservation on the capacitor, drives the output side of the capacitor (and the input of the gain element) to the mid-scale level plus the difference between the input and reference levels. The gain element amplifies this difference, and the decision element determines the sign of this difference and provides it to the input of the memory element. This memory element then captures this decision, and provides it as the digital output 170.

There are several circuit rearrangements and optimizations that can be performed by those skilled in the art, merging elements together and/or adjusting details of the switches and clock buffering, but these generally don't significantly change the operation of the circuit and can be readily understood by someone familiar in the art. As an example, decision element 366 is drawn as a continuous-time (i.e., non-sampled) comparator, and memory element 367 is drawn as an flip-flop to produce an edge-triggered digital output 170, however both could be replaced with alternate structures such as 1-stage or 2-stage sense amplifier.

The differential comparator of FIG. 3B can be viewed a variant where the single-ended signal and reference inputs 110 and 130 have been replaced with their differential equivalents 210 and 230, single-ended gain elements and decision elements 365 and 366 have been replaced with their differential equivalents 367 and 368, and the switch elements 361, 362, and 363 and the capacitor 364 have all been replicated. The differential circuit's operation is identical to the single-ended version, and it is relatively easy to those skilled in the art to envision multiple differential variants where additional optimizations and modifications are performed.

These switched-capacitor structures were extremely popular and similar techniques are still in wide use, primarily because they are substantially immune to offsets associated with the gain elements 365 and 367. Closing switch 362 and forcing the gain elements into negative feedback while connecting the input capacitor 364 to the reference input through switch 361 allows them to "auto-zero" themselves and hold a memory of the offset on the capacitor. When switches 361 and 362 open and switch 363 closes, this memory is subtracted from the system, therefore making the comparator relatively insensitive to random mismatch in this element.

Being insensitive to random mismatch in the gain elements is important because mismatch here tend to dominate the ADC design process. Because there are many of these elements and they are connected in parallel (R times) to the signal inputs, their input capacitive load is of particular importance especially for high-SQNR applications, and the ADC designer will want to minimize their capacitance. However, random mismatch tends to be proportional to the inverse of the square root of the area (and therefore the capacitance) of the input devices, therefore low capacitance (and area) implies that high input mismatches are to be expected.

One significant shortcoming of the switched-capacitor structures similar to those in FIG. 3 is the effect they have on their inputs. Switches 361 and 362, capacitor 364, and their associated parasitic capacitance elements tend to create coupling between the input and reference signals 110 and 130 and the internal clocks 325 and 326. The impact of this coupling on performance is well known to those skilled in the art and beyond the scope of this document, however these effects generally result in reduction in SQNR, increases in harmonic distortion, and create difficulties in driving the input signal, and also get worse as sampling frequency or R increase.

As a result of these issues, as Flash ADC's have started to be used in multi-GHz applications, such as in the front end of multi-Gbit/s DSP-based serial receivers, switched-capacitor comparators such as those in FIG. 3 have not been used. Instead, comparators based on sense amplifiers have become common.

A simple differential sense amplifier comparator is shown in FIG. 4. A differential signal input 210 is connected to an NMOS differential pair 461. In many analog circuit designs, the differential pair would have its current source connected to another current source, however in this comparator this other current source is replaced by a clocked device 421 that is connected to the sample clock 120. The sample clock is connected to a sense amplifier 469 which takes the differential currents out of the differential pair and produces the digital output 170. The sense amplifier is a regenerative circuit that uses positive feedback and a clock signal to amplify small voltages or currents to full-scale digital levels in extremely short periods of time. Sense amplifiers are used in a wide number of applications, including RAMs, high-performance digital core flip-flops, serial receiver input stages, and almost any other location where it is necessary to convert small signals into full-scale digital signals where speed is important. There are many topologies for constructing the sense amplifier (including some that place clocked devices between the differential pair and the sense amplifier) that are well known to those skilled in the art.

The differential sense amplifier comparator of FIG. 4 could be used as the single-ended Flash ADC comparator of FIG. 3A, simply by treating the single-ended signal input 110 and the single-ended reference input 130 as a differential signal and feeding it into the differential input 210. However, in almost all applications where the speed and performance of the sense amplifier comparator is necessary the signal and reference inputs will be differential.

For differential applications that include a reference input, an alternate sense amplifier comparator structure is shown in FIG. 5. Comparing it to the structure of FIG. 4, the differential reference input 230 drives a second differential pair 562, which is controlled by a second switched device 522. The output current from this second differential pair is added (destructively) to the current output from the first differential pair so that their differential currents are subtracted, resulting in the digital output 170 now being determined by the difference of the differential signal and reference inputs.

This structure, however, has a limited input dynamic range. This comes because for all scenarios other than differential zero on the reference input, the critical voltage where the signal and reference inputs are equal result in non-zero differential inputs on both differential pairs. The differential pairs have an input voltage range determined by their device dimensions and by the available current that can be provided by the switched devices 421 and 522, and furthermore their small signal gains (and therefore sensitivity) at non-zero differential voltages is reduced relative to what is available at differential zero. These effects, in turn, mean that this structure is usually a poor choice for use in as a Flash ADC comparator.

However, because sense amplifier comparators have lost the auto-zero offset cancellation ability that was inherent to switched-capacitor comparators, a secondary differential pair like 562 this may be used to inject a "correction" current into the sense amplifier to null out offsets from the main differential pair 461. Because the required correction signal is small, the differential pair 562 and clocked device 522 are made smaller than the main differential pair and its clocked device 421. Alternate correction approaches may use small Digital/Analog Converters (DACs).

In order to compensate for the poor dynamic range from the differential pairs of FIG. 5, an alternative subtracting sense amplifier (shown in FIG. 6) may be used for Flash ADCs. Instead of having one differential pair for the signal input and a second differential pair for the reference input, the first differential pair 661 compares the positive signal to the positive reference and a second differential pair 662 compares the negative signal to the negative reference. When the sample clock 120 rises, the two switched devices 621 and 622 provide currents to the differential pairs' common source nodes, and then the differential pairs' output currents are added (constructively) together at the input to the sense amplifier and reinforce each other to produce a digital output 170 that follows the difference between the differential signal and reference inputs. In this structure, both differential pairs see differential zero inputs when the input and reference inputs are equal, which removes many of the impairments of the original subtracting structure.

For offset correction, a correction voltage could be added (externally) to the reference input, or other approaches such as adding a third differential pair (similar to 562) may be added to the comparator, creating an additional current that would be summed into the sense amplifier input.

RF Flash ADCs

Flash ADCs using comparators such as those in FIG. 6, with additional offset correction circuitry, may be used to great effect in building DSP-based Serializer-Deserializer. DSP-based Radio Frequency (RF) receive chains may be built using mixers that translate modulated RF signals to an Intermediate Frequency (IF) or directly to Baseband (BB) where comparatively low sample rate (10's to 100's of MHz) ADCs are used to digitize the signal for further processing. Wider bandwidth RF applications may create severe challenges for mixer-based RF receivers. These challenges include frequency planning to avoid bad combinations of RF, Local Oscillator (LO) and IF frequencies in combination with ADC sample rates. When the RF signal bandwidths are relatively narrow (100's of kHz or <5 MHz) the frequency planning is relatively straight forward, however as signal bandwidths become wider (10's of MHz) frequency planning becomes much harder, and as bandwidths have become greater than 100 MHz or even as wide as 1 GHz, frequency planning has become impossible. As a result, many modern RF receiver designs are using so-called RF ADCs to sample extremely wide bandwidths and then use DSP to isolate and process the signal in the digital domain.

RF System designers are also pushing to RF ADCs because they simplify analog filtering. A mixer-based receiver requires a relatively narrowband RF filter before the mixer followed by a second narrowband BB/IF filter before the ADC. These filters, particularly if there are multiple matched BB/IF filters required as in an In-phase/Quadrature (I/O) system, tend to be complex to design, consume a lot of area, require trimming and/or calibration, and require redesign if the application changes even slightly to use different signal bands. RF ADCs with DSP filtering require fewer analog filters that are generally of lower complexity, and furthermore the need for band-specific filters is reduced and possibly even removed.

However in order to use an RF ADC, the RF ADC must be of sufficient quality and produce sufficient SNR for the application. SNR is generally degraded by a number of different impairments, Quantization Noise (SQNR), device noise, and nonlinearities such as HD3 (third-order distortion) and IM3 (third-order intermodulation). An ADC designer can make a high SQNR (i.e. low Quantization Noise) by choosing the number of comparators R to be large and provide mechanisms for controlling comparator input offsets. Device noise (including thermal and flicker noise) is a subject beyond the scope of this document, but techniques for controlling it are well known to those skilled in the art. Depending upon the application, nonlinearities such as HD3 and IM3 may be non-issues or they may be showstoppers, and in many applications such as when there are large alien signals adjacent to (or perhaps even in-band) the desired RF band, the nonlinearities may be specified independently from SNR, sometimes specifying limits on certain components (such as HD2, HD3 or IM3) or by specifying SFDR (Spurious Free Dynamic Range) or both.

For many applications, particularly narrowband applications such as medical telemetry where the information content (measured in bits/second) is relatively low or where the available bandwidths are relatively wide and comparatively simple modulation schemes are used, relatively low RF ADC SNR (and therefore SQNR, device noise and nonlinearities) values of 20-40 dB may be used. R values of 20-80 can meet these requirements and the inherent nonlinearities of Flash ADC comparators in FIG. 6 create no issues. However, for applications such as in multi-band cellular base stations, where required SNR and SFDR levels are 60-70 dB or higher, the comparator ADC becomes a serious issue.

Many of the nonlinearities of the Flash ADC comparators in FIG. 6 come from the way the two differential pairs 661 and 662 are wired to the switched devices 621 and 622. The modification between FIG. 5 and FIG. 6 results in both differential pairs seeing differential zero inputs when the signal and reference inputs are the same, which addresses many of the shortcomings of the first structure. However this in turn means every Flash ADC comparator has different common source voltages for the two differential pairs, which in turn results in different amounts of current available from the switched devices. Additionally, if the differential pairs don't have isolated p-wells, each differential pair will have different transconductance values due to the body effect. Additionally, different common source voltages result in different parasitic capacitance values on the common source nodes, and these different parasitic capacitances result in different common-mode currents at the differential pairs' outputs. Finally, unlike in most other differential pair based analog designs, the common source nodes at a sense amplifier comparator input are dynamic nodes and are continually switching, meaning that different voltages result in different settling times which in turn create different propagation delays and sampling instants for each comparator. All of these together mean that circuits like this can have significant nonlinearities, resulting in reference-voltage-dependent voltage and timing offsets that appear as degradations of SNR, SQNR, or SFDR.

As a result, in order to employ Flash ADCs for high-SNR and high-SFDR applications, improvements are required.

Generally, the present disclosure provides circuits and techniques to allow the use of Flash ADCs in high-SNR and high-SFDR RF applications.

RF Flash ADC Converters with AC-Coupled References

Constructing a high SNR and SFDR Flash ADC requires the ADC designer to minimize the effects of multiple impairments inherent to the design. Even though the subtracting sense amplifier Flash ADC comparator of FIG. 6 has wide input dynamic range and works extremely well for low-SNR and low-SFDR Flash ADC designs, its nonlinearities become limiting factors for high SNR and/or high SFDR applications. These nonlinearities are inherent to the subtraction operation performed by summing the current outputs from two differential pairs at the sense amplifier input; if the subtraction could be performed in a different manner, one which does not involve differential pairs, these nonlinearities can be avoided.

The Flash ADC in FIG. 7 is one such solution to this problem. The R reference inputs 130 are subtracted from the signal input 110 using R passive networks resistors 731 and R capacitors 732 to produce R level shifted versions of the signal input at nodes 739. The passive networks formed by resistors 731 and capacitors 732 act as high-pass filters, allowing signal content above these filters' corner frequency to appear at nodes 739. Nodes 739 are the input nodes to R clocked comparators 760 (clocked by the sample clock 120) that produce the digital outputs 170, which form a unary-weighted (thermometer) code that is converted by the thermometer-to-binary converter 180 into the final digital output 190. Comparing this Flash ADC converter to the one in FIG. 1, we can see that the clocked comparators 160 that take two inputs (both signal and reference) are replaced by the simplified clocked comparators 760 that take only one input (the level-shifted signals). For simplicity, this figure shows a single-ended design, however in most applications the actual design will be differential.

Experimental results comparing the SFDR of the Flash ADC in FIG. 1 using a circuit similar to that shown in FIG. 6 as the comparator 160, to the SFDR for the Flash ADC in FIG. 7 using a circuit similar to FIG. 4 as the comparator 760, shows an improvement of 30 dB or more. The high-pass filter characteristic formed by the resistors 731 and 732 blocks low-frequency signals, however given that the target application for this Flash ADC is to sample RF signals this is no issue.

RF Flash ADC Converters with AC-Coupled References and Interpolation

One significant shortcoming of the RF Flash ADC with AC-coupled references of FIG. 7 is that for high-SNR applications we require a large number R of comparators 760, which in turn requires the ADC designer to provide a large number R of both passive elements 731 and 732. In order to keep the high-pass filter corner low, both resistors 731 and capacitors 732 must be made relatively large, both in value and in area. Large numbers of large-area resistors and capacitors have significant parasitic capacitances, which provide additional capacitive load on the signal input, which will tend to create a low-pass filter and attenuate high signal frequencies. In addition in order to keep the overall width of the complete Flash ADC under control, the comparators 760 will tend to be relatively narrow. Ideally, the resistors and capacitors would be pitch-matched to the comparators that will be narrow, which additionally tends to increase parasitic capacitances.

Flash ADCs may use interpolation, which uses a smaller number of preamplifiers and interpolation resistors to reduce the number of required references. Applying interpolation to an AC-coupled reference Flash ADC can reduce the number of passive elements required.

Flash ADC Interpolation is shown in FIG. 8. Compared to FIG. 1, this figure focuses on the comparator array. In this design, the number of references is reduced by adding a number of preamplifiers 840 and a number of interpolating resistors 850. The preamplifiers accept both the signal and reference inputs 110 and 130, subtract them, and apply a gain A to produce nodes 848. The matched interpolation resistors 850 create additional interpolated nodes 859 between adjacent preamplifier outputs 848. In order to match the driving impedance seen by the comparators 860, additional resistors 851 that have a value half of resistors 850 are added in series with nodes 848 to create the non-interpolated nodes 858. The comparator array, driven by the sample clock 120, consists of a large number of nominally identical comparators 860, 861, and 862. Each comparator has two inputs and a digital output 170 that is determined by the sign of the sum of the inputs. Comparators 860 are connected directly to nodes 858, while comparators 861 are connected directly to the interpolated nodes 859. Comparators 862 are in turn connected between nodes 858 and 859, effectively creating additional interpolated outputs between those created by comparators 860 and 861. Taken as a whole, the overall effect is to effectively create three additional interpolated reference levels between individual reference levels 130, reducing the required number of reference levels by approximately four. There are additional benefits to this interpolation, including random offset and noise improvements; however the details of this are beyond this document.

It is possible to extend interpolation beyond what is shown here, using multiple stages of preamplifiers, by increasing the number of resistively-interpolated nodes 859 between preamplifiers, or by increasing the number of inputs on the comparators 862 to allow more of them to be inserted between nodes 858 and 859.

The preamplifier 840 is built using a structure similar to FIG. 9. Differential signal and reference inputs 210 and 230 are inputs to two differential pairs 941 and 942, which are connected in a manner similar to differential pairs 641 and 642. Instead of clocked devices 621 and 622, the differential pairs are biased by the current sources 944, which are controlled by the gate bias input 943. The output currents from the differential pairs are summed on the output resistors 945 in order to produce the differential preamplifier outputs 948.

In order for Flash ADC interpolation to work correctly, the preamplifiers 840 must have sufficient dynamic range and linearity in order to meet the overall performance targets. For high-SFDR applications, this creates significant design challenges for these elements, similar to the challenges associated with constructing the comparator of FIG. 6. These challenges are particularly hard for high frequency applications where it is impossible to use feedback techniques in their construction. In particular, linearity will most likely require that the preamplifier loads 945 and the interpolating elements 850 and 851 to be resistors.

Applying the AC-coupled reference technique to an interpolated Flash ADC results in the structure in FIG. 10. The signal and reference inputs 110 and 130 are combined with resistors 1031 and capacitors 1032 to produce multiple level-shifted copies of the signal input at nodes 1039. The amplifiers 1040 are simplified versions of 840, and drive the outputs 848.

As with how the AC-coupled reference structure simplified the comparators 760 so that they require only one input, the AC coupled reference structure simplifies the amplifiers 1040 so that they require only one input. This in turn, means that the dual differential pairs 951 and 952 may be replaced with a single differential pair, which has inherently better linearity. In addition, the overall linearity requirements of the overall structure are reduced, which allows further optimizations.

An example of an optimized structure is shown FIG. 11. In this design, the preamplifier 1040, as well as the interpolation resistors 850 and 851, have been merged together. The single differential pair 1151, driven by the current source 1144 with its bias 1143, produces an output current dependent on nodes 1148, based on the differential signal input 210. The amplifier load is formed by the source follower MOS devices 1145, and the interpolation elements are formed by the triode-mode MOS devices 1150 and 1151. MOS devices 1150 are twice the width of devices 1151, similar to how resistors 850 are half the resistance of resistors 851. The differential preamplifier outputs 1158 are connected directly to the comparators 860 and 862, while the differential interpolated outputs 1159 are connected to corresponding outputs from adjacent preamplifiers and to the comparators 861 and 862. The gates of MOS devices 1145, 1150, and 1151 are driven together from a common load bias voltage 1146. The source follower and triode-mode devices are significantly less linear than the resistors 945, 850, and 851, however when using the AC-coupled references the linearity requirements of these elements has been radically reduced. Using MOS devices allows a more compact layout than if resistors were to be used, which reduces parasitic capacitances. In addition, series resistive elements (not shown) may be inserted into the load bias voltage 1146, and these resistive elements together with the gate-source capacitance of the source followers 1145 inserts a zero into the preamplifier transfer function, which in turn acts to extend the preamplifier bandwidth.

The reduction of linearity requirements for the preamplifiers also allows alternative preamplifier constructs. FIG. 12 shows one such possibility. As with FIG. 10, the input and reference inputs 110 and 130 are combined using resistors 1031 and capacitors 1032, however the preamplifiers 1240 have two inputs whose outputs are summed to produce the straight-through nodes 1248 and the interpolated nodes 1249. The remainder of the circuit operates as in FIG. 10.

A particularly efficient MOS implementation of FIG. 12, one that merges sense amplifier comparator front ends and the preamplifiers 1240, is shown in FIG. 13. For simplicity, this figure is drawn as a single-ended circuit however a practical implementation would be differential. As before, the signal input and reference inputs 110 and 130 are combined using resistors 1031 and capacitors 1032. The preamplifiers are built using the MOS devices 1341, which replace the differential pairs of previously-drawn sense amplifier comparators. The clocked devices 1321 (driven by the sample clock input 120) are placed between the input devices 1341 and the sense amplifiers 469. Placing the clocked devices between the input devices and the sense amplifier and connecting the input devices' source nodes to ground rather than connecting them as differential pairs degrades linearity; however as before the AC coupled references reduce the linearity requirements from the comparator front ends. This structure also allows a certain degree of control over the comparator performance by controlling the common mode of the reference inputs 130 and therefore controlling the gate-source voltages of devices 1341.

As with Flash ADC interpolation in FIG. 8, the techniques of FIG. 8, FIG. 10, and FIG. 11 may be combined in multiple stages together to reduce the required number of reference voltages 130, resistors 1031, and capacitors 1032 even more than is possible using only one stage in isolation. Furthermore, more complex preamplifiers and comparators with more than two inputs may be constructed to reduce the number of reference voltages, resistors and capacitors even further.

Power-Up Voltage Offset Calibration of RF Flash ADC Converters with AC-Coupled References The sense amplifier based comparators used in FIG. 7 have no auto-zero capability, and therefore, require active calibration of comparator offsets in order not to degrade SQNR in high-SNR applications. In order to do this, mechanisms are required both to measure individual comparators' offsets and to correct for these offsets. This can be done either at power-up or in the background during normal operation, and in many applications, both are required. This document describes a preferred method for doing power-up calibration of comparator offsets when using AC-coupled references. Background calibration of comparator offsets is beyond the scope of this document.

In order to measure individual comparators' offsets, most Flash ADC designs require the ability to isolate individual comparators from the signal path and drive their inputs to zero. For applications where a S&H is used, this is relatively easy to perform at power-up, but for applications without a S&H this is difficult. However, the AC-coupled reference structure of FIG. 10 allows a straight-forward alternative, shown in FIG. 14. This figure shows how individual comparator reference voltages are generated using a differential reference input 1430, a common-mode reference 1431, and a number of resistors 1435. Resistors 1435 create a resistor divider chain between two extreme reference voltages 1438 to generate intermediate reference voltages 1439. In normal operation, switches 1432 select the reference input 1430, and the ADC references 1438 and 1439 are all different. During power-up comparator offset voltage calibration, switches 1432 select the common-mode voltage 1431, therefore all comparators see the same reference voltages, so all nodes 739 are copies of the input signal 110.

During calibration, so long as the input signal is DC-balanced (a reasonable expectation) all comparator inputs 739 will be at mid-rail, and so long as the input signal is aperiodic with the sample clock 120 the comparator outputs 170 will also be DC balanced. If the comparator outputs aren't DC balanced, the amount of imbalance is a measure of the amount of comparator voltage offset. The additional elements required to use this knowledge are drawn in FIG. 15. Each comparator is corrected individually. At power-up, switches 1431 select the common-mode input, and the comparator outputs 170 are observed through counter 1561. The output from the comparator taken as the input to a correction algorithm 1565, and the algorithm updates a per-comparator memory element 1567 with a measure of the offset. The memory output drives a per-comparator Digital/Analog Converter (DAC) to produce an offset correction input, which is applied to the comparator 1560 to cancel the offset. There are many possible ways to construct the DAC and comparator, and the specific details are beyond the scope of this document.

The complete power-up offset correction algorithm of this embodiment is summarized in Table 1.

TABLE 1

Power-Up Flash ADC Comparator Voltage Offset Correction Algorithm

| Step # | Operation |
| --- | --- |
| 1 | Program switches 1432 to select common-mode reference 1431 |
| 2 | For each comparator |
| 2.1 | Program memory 1567 to be mid-scale |
| 2.2 | Count the number of 1's at the comparator output 170 during N |
| 2.3 | While the number of 1's is not N/2, repeat: |
| 2.3.1 | Adjust memory 1567 to bring the number of 1's closer to N/2 |
| 2.3.2 | Count the number of 1's at the comparator output 170 during N |
| 2.4 | Hold the value of memory 1567 constant |
| 3 | Program switches 1432 to select the reference inputs 1430 |

The correction algorithm may be implemented in hardware or software or some combination thereof. The counter and correction algorithm may be unique per-comparator elements, or they may be time multiplexed to reduce their costs. If they are time multiplexed, an additional multiplexer to select between multiple comparator outputs must be added to the design.

Advantageously, in some aspects of the present disclosure, AC-coupled reference levels allow for a reduced-complexity comparator, and greater linearity which permits RF Flash ADCs to be used for higher-SFDR applications. In some aspects of the present disclosure, interpolation reduces the number reference generation devices for equivalent SQNR and fewer reference generation devices reduce the parasitic capacitances due to passive elements (resistors and capacitors) and allow higher-bandwidth applications. In some aspects of the present disclosure, AC-coupled reference levels allow a relatively simple technique to be used for power-up calibration of the RF Flash ADC comparators' offset voltages.

Three closely-related aspects of RF Flash ADC circuits are disclosed herein. These aspects relate to multiple techniques that may be implemented to feasibly use an RF Flash ADC in high-SNR and high-SFDR applications. The first technique, AC-coupled references, allows for simpler RF Flash ADC comparator structures to be built with higher linearity. The second technique, input interpolation, allows for the use of fewer reference levels and fewer parasitic capacitors in order to maximize the available bandwidth. The third technique uses the AC-coupled references to easily inject known signal levels into the RF Flash ADC comparators' inputs in order to measure and correct their offset voltages on power-up.

As described herein, a Single Threshold Flash ADC uses AC-coupled reference voltage levels in constructing a Radio Frequency (RF) Flash Analog/Digital Converter (ADC) that allows simplified construction of the Flash ADC comparators and with improved linearity, allowing for highly-linear sampling of high-speed modulated signals. As described herein, an Interpolated Flash ADC uses input interpolation to reduce the number of AC-coupled reference voltage levels required in constructing a Radio Frequency (RF) Flash Analog/Digital Converter (ADC) that allows simplified construction of the Flash ADC comparators and with improved linearity, allowing for highly-linear sampling of high-speed modulated signals. Simple input interpolation circuits are also described. As described herein, a Power ADC is used to measure and correct random input voltage offsets of the comparators used to construct a Radio Frequency (RF) Flash Analog/Digital Converter (ADC) that makes use of AC-coupled reference levels to simplify the construction of the Flash ADC comparators with improved linearity. The use of AC-coupled references allows for particularly straight forward power-up calibration of the comparators against input voltage offsets with a minimum of circuitry.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof. Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A system comprising:
   a plurality of preamplifiers, wherein a first input of each of the plurality of preamplifiers is operably coupled to a radio frequency (RF) input, and wherein a second input of each of the plurality of preamplifiers is operably coupled to a reference level of a plurality of reference levels; and
   a sampling circuit operably coupled to an output of each of the plurality of preamplifiers, wherein the sampling circuit is operable to produce a plurality of digital outputs.

2. The system of claim 1, wherein the system comprises a converter operable to convert the plurality of digital outputs to a binary output.

3. The system of claim 1, wherein the system comprises a series of resistors between a first reference input and a second reference input, each reference level of the plurality of reference levels being produced along the series of resistors.

4. The system of claim 3, wherein the system comprises a first switch for selecting the first reference input and a second switch for selecting the second reference input.

5. The system of claim 1, wherein the sampling circuit comprises a plurality of comparators, wherein the output of each of the plurality of preamplifiers is operably coupled to an input of a comparator of the plurality of comparators.

6. The system of claim 1, wherein the sampling circuit comprises:
   a first comparator having a first input and a second input, wherein the first input and the second input are both operably coupled to an output of a first preamplifier of the plurality of preamplifiers; and
   a second comparator having a first input operably coupled to the output of the first preamplifier of the plurality of preamplifiers, wherein a second input of the second comparator is operably coupled to an output of a second preamplifier of the plurality of preamplifiers.

7. The system of claim 1, wherein the sampling circuit comprises:
   a first differential amplifier having a first input and a second input operably coupled to an output of a first preamplifier of the plurality of preamplifiers;
   a second differential amplifier having a first input operably coupled to the output of the first preamplifier of the plurality of preamplifiers and having a second input operably coupled to an output of a second preamplifier of the plurality of preamplifiers;
   a first comparator having a first input and a second input operably coupled to an output of the first differential amplifier; and
   a second comparator of the plurality of comparator having a first input operably coupled to the output of the first differential amplifier and having a second input operably coupled to an output of the second differential amplifier.

8. The system of claim 7, wherein the system comprises a converter operable to convert the plurality of digital outputs to a binary output, each digital output of the plurality of digital outputs being operably coupled to an output from each of the plurality of comparators.

9. The system of claim 1, wherein the sampling circuit comprises a plurality of comparators, wherein the offset of each comparator of the plurality of comparators is corrected individually using a stored offset value.

10. A method comprising:
    receiving, by a first input of each of a plurality of preamplifiers, a radio frequency (RF) input,
    receiving, by a second input of each of the plurality of preamplifiers, a respective reference level of a plurality of reference levels; and
    producing a plurality of digital outputs by sampling an output of each of the plurality of preamplifiers using a sampling circuit.

11. The method of claim 10, wherein the method comprises converting the plurality of digital outputs to a binary output.

12. The method of claim 10, wherein the method comprises generating each reference level of the plurality of reference levels along a series of resistors between a first reference input and a second reference input.

13. The method of claim 12, wherein the method comprises selecting the first reference input and selecting the second reference input.

14. The method of claim 10, wherein the sampling circuit comprises a plurality of comparators, wherein the output of each of the plurality of preamplifiers is operably coupled to an input of a comparator of the plurality of comparators.

15. The method of claim 10, wherein the sampling circuit comprises:
    a first comparator having a first input and a second input, wherein the first input and the second input are both operably coupled to an output of a first preamplifier of the plurality of preamplifiers; and a second comparator having a first input operably coupled to the output of the first preamplifier of the plurality of preamplifiers, wherein a second input of the second comparator is operably coupled to an output of a second preamplifier of the plurality of preamplifiers.

16. The method of claim 10, wherein the sampling circuit comprises:
 a first differential amplifier having a first input and a second input operably coupled to an output of a first preamplifier of the plurality of preamplifiers;
 a second differential amplifier having a first input operably coupled to the output of the first preamplifier of the plurality of preamplifiers and having a second input operably coupled to an output of a second preamplifier of the plurality of preamplifiers;
 a first comparator having a first input and a second input operably coupled to an output of the first differential amplifier; and
 a second comparator of the plurality of comparator having a first input operably coupled to the output of the first differential amplifier and having a second input operably coupled to an output of the second differential amplifier.

17. The method of claim 16, wherein the method comprises converting the plurality of digital outputs to a binary output, each digital output of the plurality of digital outputs being operably coupled to an output from each of the plurality of comparators.

18. The method of claim 10, wherein the sampling circuit comprises a plurality of comparators, wherein the offset of each comparator of the plurality of comparators is corrected individually using a stored offset value.

19. The system of claim 18, wherein the stored offset value is determined according to a counter operably coupled to each comparator output.

20. The method of claim 18, wherein the method comprises determining the stored offset value according to a counter operably coupled to each comparator output.

* * * * *